US009847136B2

(12) United States Patent
Kim et al.

(10) Patent No.: US 9,847,136 B2
(45) Date of Patent: Dec. 19, 2017

(54) OPERATING METHOD FOR HOST DEVICE AND MEMORY SYSTEM INCLUDING HOST DEVICE AND STORAGE DEVICE

(71) Applicant: SAMSUNG ELECTRONICS CO., LTD., Suwon-si, Gyeonggi-do (KR)

(72) Inventors: Cholmin Kim, Changwon-si (KR); Jiyong Lee, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/290,056

(22) Filed: Oct. 11, 2016

(65) Prior Publication Data
US 2017/0123687 A1    May 4, 2017

(30) Foreign Application Priority Data

Nov. 2, 2015 (KR) .................. 10-2015-0153278

(51) Int. Cl.
*G11C 16/32* (2006.01)
*G06F 3/06* (2006.01)
*G11C 16/04* (2006.01)
*G11C 16/26* (2006.01)
*G11C 16/34* (2006.01)

(52) U.S. Cl.
CPC ............ *G11C 16/32* (2013.01); *G06F 3/0611* (2013.01); *G06F 3/0653* (2013.01); *G06F 3/0656* (2013.01); *G06F 3/0679* (2013.01); *G11C 16/0466* (2013.01); *G11C 16/0483* (2013.01); *G11C 16/26* (2013.01); *G11C 16/3418* (2013.01); *G11C 16/3431* (2013.01)

(58) Field of Classification Search
CPC .... G06F 3/0611; G06F 3/0679; G06F 3/0656; G06F 3/0653; G11C 16/3431; G11C 16/3418; G11C 16/32; G11C 16/26; G11C 16/0466; G11C 16/0483
See application file for complete search history.

(56) References Cited

U.S. PATENT DOCUMENTS

| | | | |
|---|---|---|---|
| 7,325,090 | B2 | 1/2008 | Ronen |
| 7,477,547 | B2 | 1/2009 | Lin |
| 7,679,133 | B2 | 3/2010 | Son et al. |
| 8,169,825 | B1 | 5/2012 | Shalvi et al. |
| 8,243,525 | B1 | 8/2012 | Kan |
| 8,440,542 | B2 | 5/2013 | Sekar et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,902,669 | B2 | 12/2014 | Yang et al. |
| 2011/0233648 | A1 | 9/2011 | Seol et al. |
| 2014/0108705 | A1 | 4/2014 | Gorobets |
| 2015/0049547 | A1 | 2/2015 | Kim |
| 2015/0113205 | A1 | 4/2015 | Cai et al. |
| 2015/0169398 | A1 | 6/2015 | Chunn et al. |

*Primary Examiner* — Harry W Byrne
*Assistant Examiner* — Ajay Ojha
(74) *Attorney, Agent, or Firm* — Volentine & Whitt, PLLC

(57) ABSTRACT

A host device controls a storage device to perform a read operation of a read data unit with respect to selected memory areas. A read latency corresponding to the read operation of the storage device is stored in a read latency table of the host device. A determination is made whether a latency change ratio exceeds a threshold value, based on the read latency stored in the read latency table. The data host requests a data retention operation from the storage device, through a retention command, when the latency change ratio exceeds the threshold value.

20 Claims, 11 Drawing Sheets

FIG. 5

RLAT

| Read Trial | Read Latency (s) |
|---|---|
| ROP1 | tRD1 |
| ROP2 | tRD2 |
| ROP3 | tRD3 |
| ROP4 | tRD4 |
| ROP5 | tRD5 |

FIG. 9

RLAT1

| DEVICE 1 ||

| Read Trial | Read Latency (s) |
|---|---|
| ROP11 | tRD11 |
| ROP12 | tRD12 |
| ROP13 | tRD13 |
| ROP14 | tRD14 |
| ROP15 | tRD15 |

RLAT2

| DEVICE 2 ||

| Read Trial | Read Latency (s) |
|---|---|
| ROP21 | tRD21 |
| ROP22 | tRD22 |
| ROP23 | tRD23 |
| ROP24 | tRD24 |
| ROP25 | tRD25 |

FIG. 11
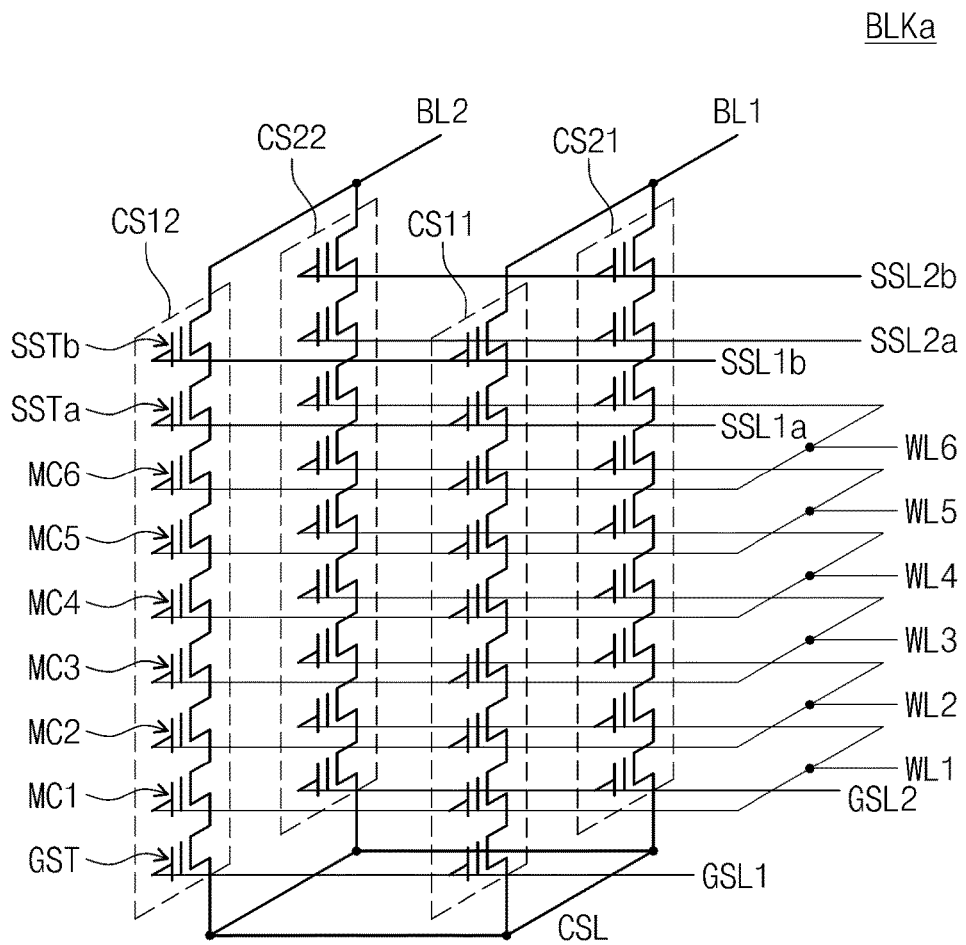
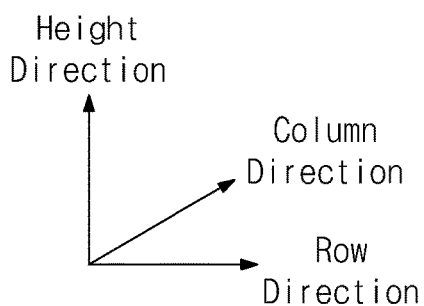

US 9,847,136 B2

OPERATING METHOD FOR HOST DEVICE AND MEMORY SYSTEM INCLUDING HOST DEVICE AND STORAGE DEVICE

CROSS-REFERENCE TO RELATED APPLICATIONS

A claim for priority under 35 U.S.C. §119 is made to Korean Patent Application No. 10-2015-0153278 filed Nov. 2, 2015, in the Korean Intellectual Property Office, the entire contents of which are hereby incorporated by reference.

BACKGROUND

Embodiments of the disclosure described herein relate to a memory device, and more particularly, relate to a method for a host device to control a storage device and a memory system including the host device and the storage device.

Mobile electronic devices such as digital cameras, MP3 players, cellular phones, smart phones, and tablet PCs are being widely used. Such mobile electronic devices use a nonvolatile memory device such as a flash memory as a medium for storing data. The nonvolatile memory device retains data stored therein even at power-off and has low-power and high-integration characteristics.

In the nonvolatile memory device, data retention characteristics may influence data integrity. For the flash memory device, charges (or electrons) stored in a floating gate or charge trap layer are leaked due to various causes to the outside thereof. For example, charges (or electrons) stored in a floating gate or charge trap layer are leaked through various fail mechanisms such as thermal ionic emission and charge diffusion through a defective insulating layer, ion impurities, and lapse of time. The leakage of charges causes a decrease in a threshold voltage of a memory cell. In contrast, various stresses cause an increase in a threshold voltage of a memory cell. An issue according to a change of a threshold voltage of a memory cell is called "retention problem".

Accordingly, it is required to have a technique for preventing the reliability from being lowered due to charge leakage and the like.

SUMMARY

Embodiments of the disclosure provide a storage device control method of a host device which improves reliability by preventing a retention problem according to a high-temperature phenomenon or non-periodic use of a memory device and a memory system including the host device and the storage device.

One aspect of embodiments of the disclosure is directed to provide a method in which a host device controls a storage device. The method may include controlling the storage device at the host device to perform a read operation of a read data unit with respect to selected memory areas, storing a read latency corresponding to the read operation of the storage device in a read latency table of the host device, determining whether a latency change ratio exceeds a threshold value, based on the read latency stored in the read latency table, and requesting a data retention operation from the storage device through a retention command when the latency change ratio exceeds the threshold value.

Another aspect of embodiments of the disclosure is directed to provide a host device and a memory system including a plurality of storage devices, each comprising a plurality of nonvolatile memory devices. The host device: (1) controls each of the storage devices to perform a read operation by a read data unit with respect to selected memory areas, (2) stores a read latency corresponding to the read operation performed on each of the storage devices in a read latency table, (3) determines whether a latency change ratio exceeds a threshold value, based on the read latency table for each storage device, and (4) requests, through a retention command, a data retention operation from a storage device having a latency change ratio exceeding the threshold value.

Another aspect of embodiments of the disclosure is directed to provide a method executed by a host device. The method includes determining a first time difference between the execution of a first read operation of a selected memory cell of a nonvolatile memory and the execution of a previous read operation or program operation of the selected memory cell. A second time difference is determined between the execution of a second read operation, subsequent to the first read operation, of the selected memory cell and the execution of the first read operation. A determination is made whether the ratio of the second time difference to the first time difference exceeds a first predetermined value. A request is communicated for the nonvolatile memory to determine the data retention quality of data stored in the memory cell when the ratio exceeds the first predetermined value.

BRIEF DESCRIPTION OF THE DRAWINGS

The above and other objects and features will become apparent from the following description with reference to the following figures, wherein like reference numerals refer to like parts throughout the various figures unless otherwise specified, and wherein:

FIG. 5 is a diagram illustrating a read latency table for storing and managing read latencies;

FIG. 9 is a diagram illustrating read latency tables for storing and managing read latencies, according to another embodiment of the disclosure;

FIG. 11 is a circuit diagram illustrating a memory block according to an embodiment of the disclosure.

DETAILED DESCRIPTION

All the above-mentioned features and the following description are an exemplary description to help understand the present disclosure. That is, the present disclosure should not be construed as limited to the embodiments set forth herein, and may be embodied in different forms. The following embodiments are merely examples for fully disclosing the present disclosure, and are described for transferring the disclosure to those skilled in the art. Therefore, if there are many methods for implementing the components of the present disclosure.

If it is mentioned that any configuration includes specific components in the present specification, or any process includes specific steps, this means that other elements or other steps may be further included. That is, the terms used herein are only intended to describe the specific embodiments, and is not intended to limit the concepts of the present disclosure. Further, the examples described to help understand the present disclosure include its complementary embodiments.

The terms used herein have the meaning in which those skilled in the art understand in general. The terms commonly used are to be construed as having a consistent meaning in the context of the present specification. In addition, the terms used herein should not be interpreted in an overly ideal or formal sense unless expressly so defined herein. Embodiments of the present disclosure will be described below with reference to attached drawings.

Figure 1:
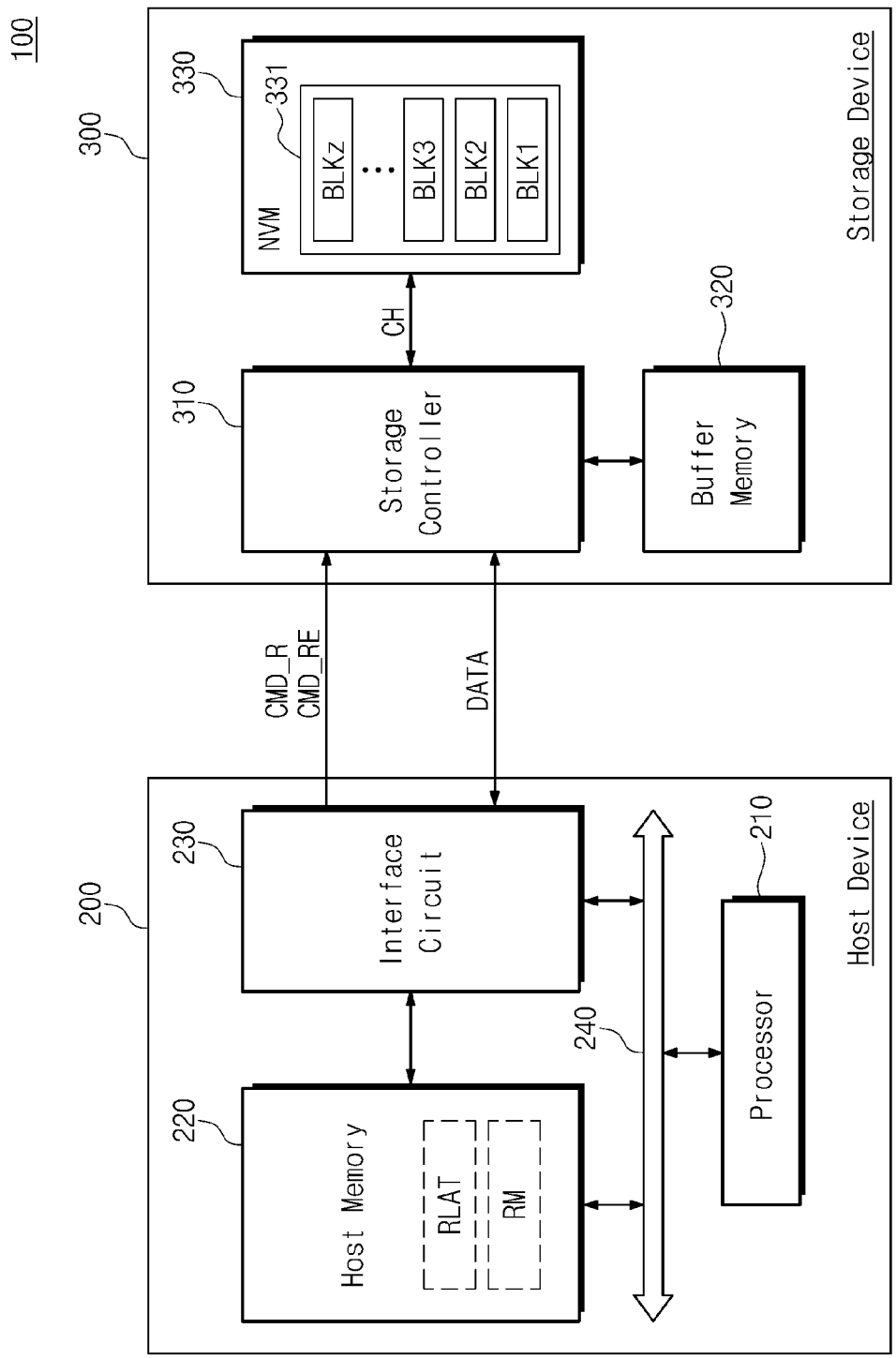
FIG. 1 is a block diagram illustrating a memory system according to an embodiment of the disclosure.

FIG. 1 is a block diagram illustrating a nonvolatile memory according to an embodiment of the disclosure.

Referring to FIG. 1, a computing system 100 according to an embodiment of the disclosure may include a host device 200 and a storage device 300.

The host device 200 may provide the storage device 300 with a read command CMD_R and a retention command CMD_RE. The host device 200 may control the storage device 300 through the read command CMD_R so as to perform a read operation. The host device 200 may control the storage device 300 through the retention command CMD_RE so as to perform a data retention operation.

The host 200 of the disclosure may include a processor 210, a host memory 220, and an interface circuit 230.

The processor 210 may execute a variety of software (e.g., an application program, an operating system, and a device driver) loaded on the host memory 220. The processor 210 may execute an operating system (OS), application programs, and the like. The processor 210 may be a homogeneous multi-core processor or a heterogeneous multi-core processor.

An application program or data to be processed by the processor 210 may be loaded on the host memory 220. For example, an application program, a file system, a device driver, and the like may be loaded on the host memory 220. A retention manager RM and a read latency table RLAT which are used to manage a read latency RL may be loaded on the host memory 220.

The read latency RL may refer to a time when data, DATA, of a read data unit is read from the storage device 300 based on the read command CMD_R of the host device 200 and the read data is transferred to the host device 200. For example, the retention manager RM may be stored in a programmable ROM (PROM) (not shown) of the host device 200 or in the storage device 300. The retention manager RM may be loaded on the host memory 220 from the PROM or the storage device 300.

In detail, the retention manager RM of the host device 200 may store and manage a read latency RL corresponding to a read operation which is performed on the storage device 300. For example, the retention manager RM of the host device 200 may store read latencies RL, each of which corresponds to a read operation which is performed on the storage device 300, with the read latency table RLAT. The procedure for storing a read latency RL in the read latency table RLAT will be described with reference accompanying drawings.

The retention manager RM of the host device 200 may manage a read latency RL about a read command transferred to the storage device 300. For example, the retention manager RM of the host device 200 may manage read latencies RL stored in the read latency table RLAT. In detail, the retention manager RM may determine whether a latency change ratio exceeds a threshold value TH_V. In this case, the latency change ratio may be a difference between a read latency of the most recently performed read operation and a read latency of a current read operation.

The retention manager RM of the host device 200 may determine whether a retention problem occurs on the storage device 300, based on a result of comparing the latency change ratio and the threshold value TH_V. For example, when the latency change ratio exceeds the threshold value TH_V, the retention manager RM may determine the probability that a retention problem occurs on the storage device 300, as being high. The procedure for comparing the latency change ratio and the threshold value TH_V and determining whether a retention problem occurs on the storage device 300 will be described with reference to accompanying drawings.

The retention manager RM of the host device 200 may control the storage device, having a high probability of a retention problem, so as to perform the data retention operation. In detail, under control of the retention manager RM, the retention command CMD_RE may be outputted to the storage device 300 through the interface circuit 230.

The host device 200 may control the storage device 300 through the retention command CMD_RE so as to perform a data retention operation with respect to a memory block, which includes a page where a read operation is performed. An operation of the retention manager RM loaded on the host memory 220 of the host device 200 will be described with reference to accompanying drawings.

The interface circuit 230 may provide a physical connection between the host device 200 and the storage device 300. That is, for connection between the host device 200 and the storage device 300, the interface circuit 230 may convert the format of data such as a command, an address, data, and the like, which correspond to various access requests issued from the host device 200, or the format of a to-be-exchanged command. The interface circuit 230 may include at least one of protocols such as universal serial bus (USB), small computer system interface (SCSI), PCI express, ATA, parallel ATA (PTA), serial ATA (SATA), and serial attached SCSI (SAS).

An internal bus 240 may include a data bus and a control bus. The data bus may transfer data in the host device 200, and the control bus may transfer the following control information in the host device 200: a command and an address.

The storage device 300 may access a nonvolatile memory device 330 in response to a command CMD from the host device 200 or may perform various requested operations. The storage device 300 may include a storage controller 310, a buffer memory 320, and the nonvolatile memory device 330.

The storage controller 310 may adjust the magnitude of data exchanged between the host device 200 and the storage device 300 or may convert the magnitude of a command to be exchanged therebetween.

The buffer memory 320 may temporarily store write data or read data.

The nonvolatile memory device 330 may perform a read/write operation under control of the storage controller 310.

Figure 2:
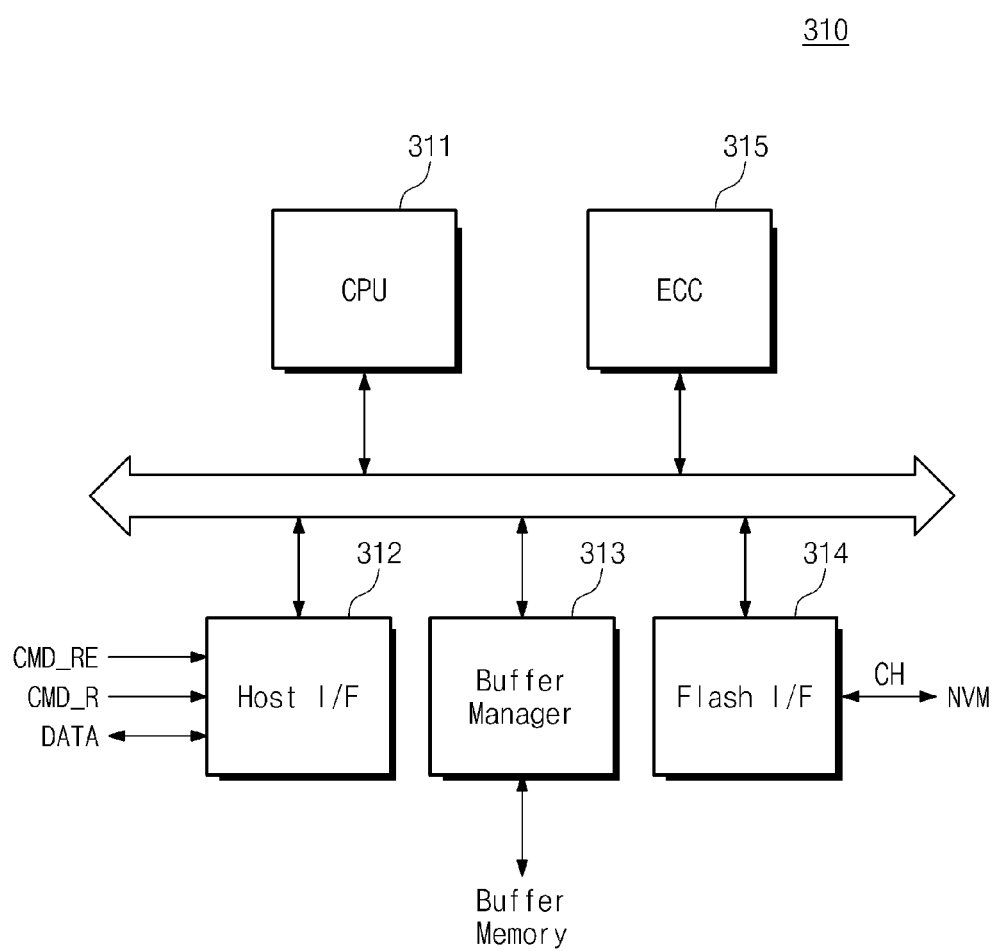
FIG. 2 is a block diagram illustrating a storage controller illustrated in FIG. 1, according to an embodiment of the disclosure.

FIG. 2 is a block diagram illustrating a storage controller 310 illustrated in FIG. 1. The storage controller 310 may adjust the magnitude of data to be exchanged between the host device 200 and the storage device 300 or may convert the magnitude of a command to be exchanged therebetween.

Referring to FIG. 2, the storage controller 310 may include a central processing unit (CPU) 311, a host interface 312, a buffer manager 313, a flash interface 314, and an error correction block 315.

The CPU 311 may transfer a variety of information, which is needed to perform a read/write operation of the nonvolatile memory device 300, to registers of the host interface 312 and flash interface 314. The CPU 311 may operate based on firmware which is provided for various control operations of the storage controller 310. For example, the CPU 311 may execute a flash translation layer (FTL) for performing: (1) garbage collection for managing the nonvolatile memory device 300, (2) address managing, (3) wear leveling, and (4) the like.

The host interface 312 may communicate with the host device 200. The host interface 312 may provide a physical connection between the host device 200 and the storage device 300. That is, the host interface 312 may adjust the magnitude of data to be exchanged between the host device 200 and the storage device 300 to be fit to a bus format or may convert the magnitude of a command to be exchanged therebetween.

The bus format of the host device 200 may include at least one of a universal serial bus (USB), a small computer system interface (SCSI), a PCI express, ATA, a parallel ATA (PTA), a serial ATA (SATA), or a serial attached SCSI (SAS). An NVMe protocol installed in the host device 200 that exchanges data in a PCI express manner may be applied to the host interface 312.

The buffer manager 313 may control read and write operations of the buffer memory 320. For example, the buffer manager 313 may temporarily store write data or read data in the buffer memory 320. The buffer manager 313 may classify a memory area of the buffer memory 320 by a stream unit under control of the CPU 311.

The flash interface 314 may exchange data with the nonvolatile memory device 330. The flash interface 314 may write data transferred from the buffer memory 320 to the nonvolatile memory device 330 through a memory channel CH. Read data which is read out from the nonvolatile memory device 330 and is provided through the memory channel may be collected by the flash interface 314. The collected data may be stored in the buffer memory 320.

The error correction block 315 may perform an error correction operation. The error correction block 315 may perform error correction encoding based on data to be written to the nonvolatile memory device 330. The error correction encoded data may be transferred to the nonvolatile memory device 330 through the memory interface 314. The error correction block 315 may perform error correction decoding on data received through the memory interface 314 from the nonvolatile memory device 330. In an embodiment, the error correction block 315 may be included in the memory interface 314 as a component of the memory interface 314.

In particular, error correction which is performed by the error correction block 315 may be associated with a retention problem. In detail, the number of errors included in read data of a memory device used non-periodically or in a high-temperature environment may be greater than the number of errors included in read data of a memory device used periodically in at a high-temperature environment. As a result, a time taken to perform error correction by the error correction block 315 may increase. This may mean that a time (i.e., a read latency RL) when a signal arrives at the host device 200 from the storage device 300 increases.

Figure 3:
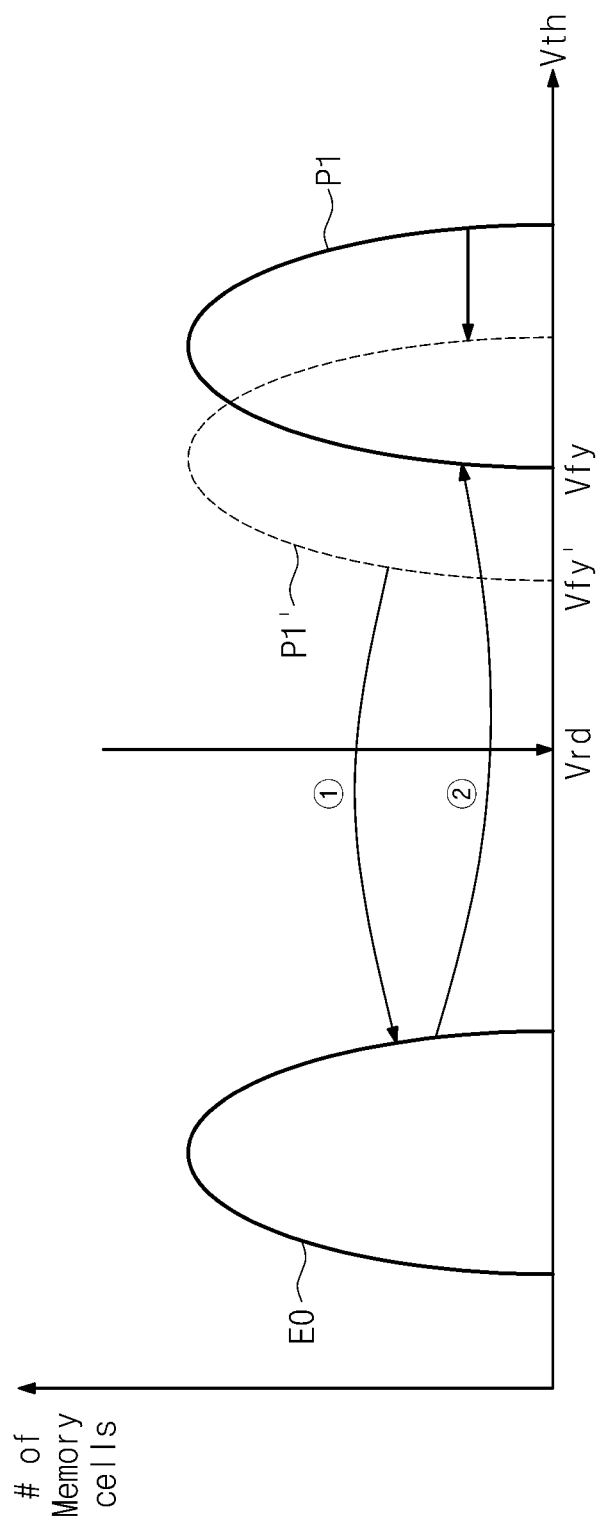
FIG. 3 is a diagram for describing a retention problem caused in a memory device at a high-temperature or non-periodical operating environment and a data retention operation according to an embodiment of the disclosure.

FIG. 3 is a diagram for describing a retention problem caused in a memory device at a high-temperature or non-periodical operating environment and a data retention operation according to an embodiment of the disclosure.

Referring to FIG. 3, as time elapses, a threshold voltage of a memory cell may decrease due to causes such as charge leakage or a defect of an insulating layer with the lapse of time. In this case, the number of errors included in read data may increase. An issue according to a change of a threshold voltage of a memory cell is called "retention problem".

The data retention operation for overcoming the retention problem may refer to an operation of restoring the decreased threshold voltage of the memory cell.

In FIG. 3, an X-axis represents a threshold voltage Vth, and a Y-axis represents the number of memory cells. A plurality of memory cells may be programmed by writing of data to a program state P1. During a program operation, memory cells may be programmed to have threshold voltages higher than or equal to a verification voltage Vfy. Electrons injected into a floating gate may be leaked due to lapse of time or a defect of an insulating layer. In this case, a threshold voltage distribution of memory cells may be shifted from the program state P1 to a leakage state P1'. The cells having the leakage state P1' have threshold voltages higher than or equal to Vfy'.

The leakage state P1' may be gradually shifted toward a lower threshold voltage level with the lapse of time. If memory cells each having a threshold voltage lower than a read voltage Vrd occur, memory cells, which are read as an erase state E0, from among memory cells programmed to the program state P1 may occur. To solve the above-described issue and maintain data integrity, after reading data stored in first memory areas of a retention target and storing the read data in a buffer memory, a memory device which is incapable of being overwritten may erase the first memory areas (①). The data stored in the buffer memory may be written at second areas of an erase state (②).

An embodiment of the disclosure exemplified as a data retention operation is performed with respect to a flash memory device. However, the scope and spirit of the disclosure may not be limited thereto. For example, the disclosure may be applied to all memory devices where resistance values or threshold values of memory cells drift with the lapse of time. An error detection and correction operation about read data may be added to improve the reliability of the data retention operation.

Figure 4:
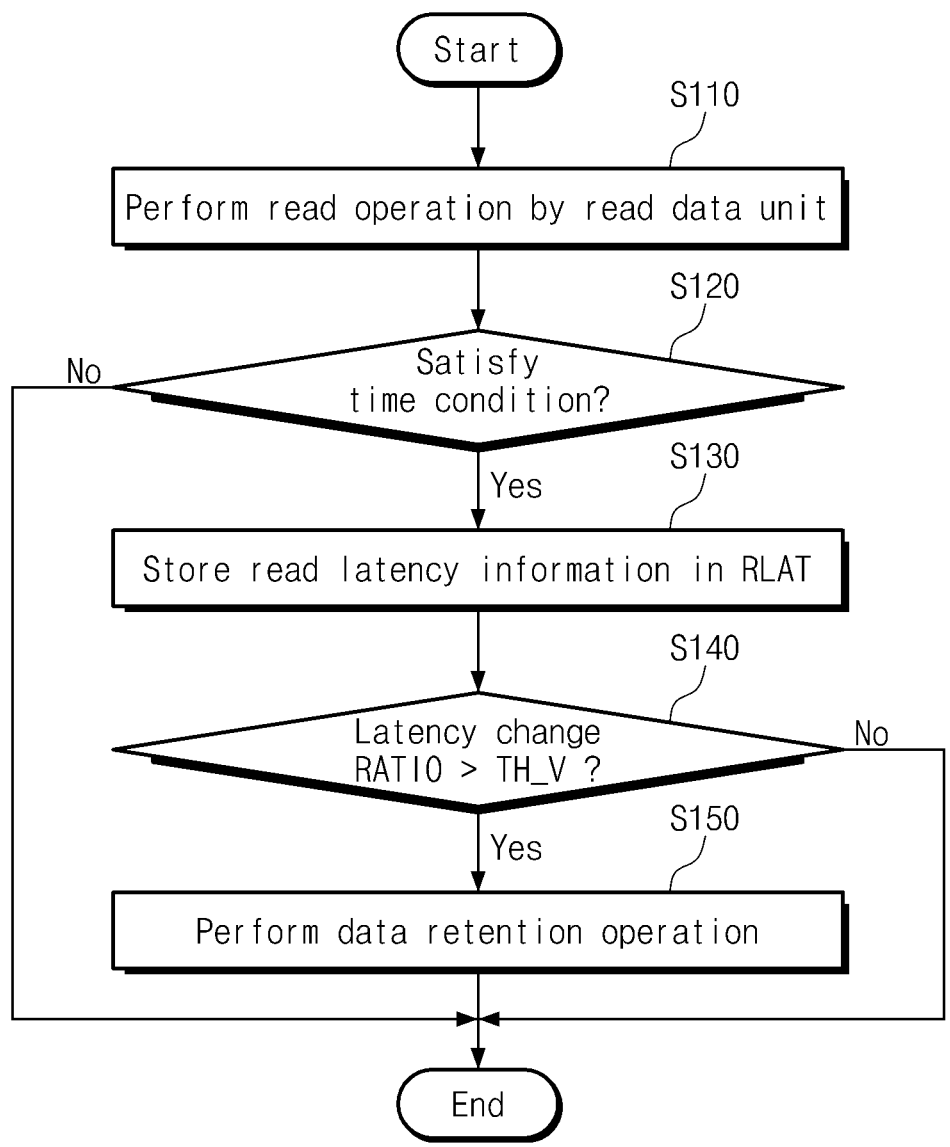
FIG. 4 is a flow chart illustrating an operating method of a storage system according to an embodiment of the disclosure.

FIG. 4 is a flow chart illustrating an operating method of a storage system according to an embodiment of the disclosure.

Referring to FIGS. 1 and 4, a data retention operating method of the memory system 100 which is executed by a retention manager RM loaded on the host memory 220 of the host device 200 is as follow.

In step S110, the host device 200 may control the storage device 300 to perform a read operation of a read data unit. The read data unit may be a unit of read data which the host device 200 requests from the storage device 300 through a read request. For example, the read data unit may be 4 KB (kilo bytes). The read data unit may vary according to a kind of the host device 200 or the storage device 300.

In step S120, the retention manager RM of the host device 200 may determine whether a read operation of the read data unit is performed on the storage device 300 within a specific time. For example, in the case where the current read operation is performed within a specific time (i.e., does not satisfy a time condition) from the most recent read operation, the retention manager RM of the host device 200 may end the procedure without storing a read latency of the current read operation, thereby reducing the amount of data which the retention manager RM of the host device 200 stores and manages. This may mean that overhead of the memory system 100 is reduced. However, the host device 200 according to an embodiment of the disclosure may perform step S130 without performing step S120.

In step S130, in the case where the current read operation is performed beyond a specific time from the most recent read operation, the retention manager RM of the host device 200 may store a read latency by a read data unit of the storage device 300 in the read latency table RLAT. In particular, a read latency of a read operation may be stored in an electrically erasable and programmable ROM (EE-PROM) of the host device 200.

In step S140, the retention manager RM of the host device 200 may determine whether a latency change ratio exceeds a threshold value TH_V. For example, the latency change ratio may be a difference between a read latency of the most-recently previous read operation and a read latency of a current read operation. If the latency change ratio is smaller than the threshold value TH_V, the retention manager RM of the host device 200 may end the procedure without performing step S150.

Furthermore, in the case where a read operation of a read data unit performed on the storage device 300 is a first read operation, the retention manager RM may perform step S110 to step S130 and may end the procedure without performing step S140 in which there is determined whether the latency change ratio exceeds the threshold value TH_V.

In step S150, when the latency change ratio exceeds the threshold value TH_V, the retention manager RM of the host device 200 may determine the probability that a retention problem occurs on the storage device 300, as being high. The host device 200 may control the storage device 300 having a high probability of a retention problem so as to perform the data retention operation. The data retention operation is described with reference to FIG. 3, and a detailed description thereof is thus omitted.

FIG. 5 is a diagram illustrating a read latency table RLAT for storing and managing read latencies.

Referring to FIGS. 1 to 5, when read operations of a read data unit are performed on the storage device 300 under control of the host device 200, the retention manager RM of the host device 200 may store the read latency table RLAT. For example, when read operations ROP1 to ROP5 of the read data unit are performed with respect to a specific page (e.g., a page read-requested by the host device 200) of the storage device 300, the retention manager RM may store read latencies in a latency table (RLAT) of a block which includes the page where the read operation is performed.

For example, when read operations of the read data unit are performed with respect to a specific page, the retention manager RM may store all or a part of read latencies tRD1 to tRD5 of the read operations ROP1 to ROP5.

For another example, when read operations of the read data unit are performed. The retention manager RM may store read latencies of the most-recent previous read operation and a current read operation and may erase the remaining read latencies.

When each of the read operations of the read data unit is performed, the memory system 100 according to an embodiment of the disclosure may repeat steps S110 to S150 of FIG. 4.

In an embodiment, the host device 200 may request a monitor read operation from the storage device 300 through the read command CMD_R to monitor whether a retention problem of the storage device 300 occurs, not to obtain data.

The scope and spirit of the disclosure is not limited to the read latency table RLAT described with reference to FIG. 5 and may be applied to various equivalent embodiments.

Figure 6:
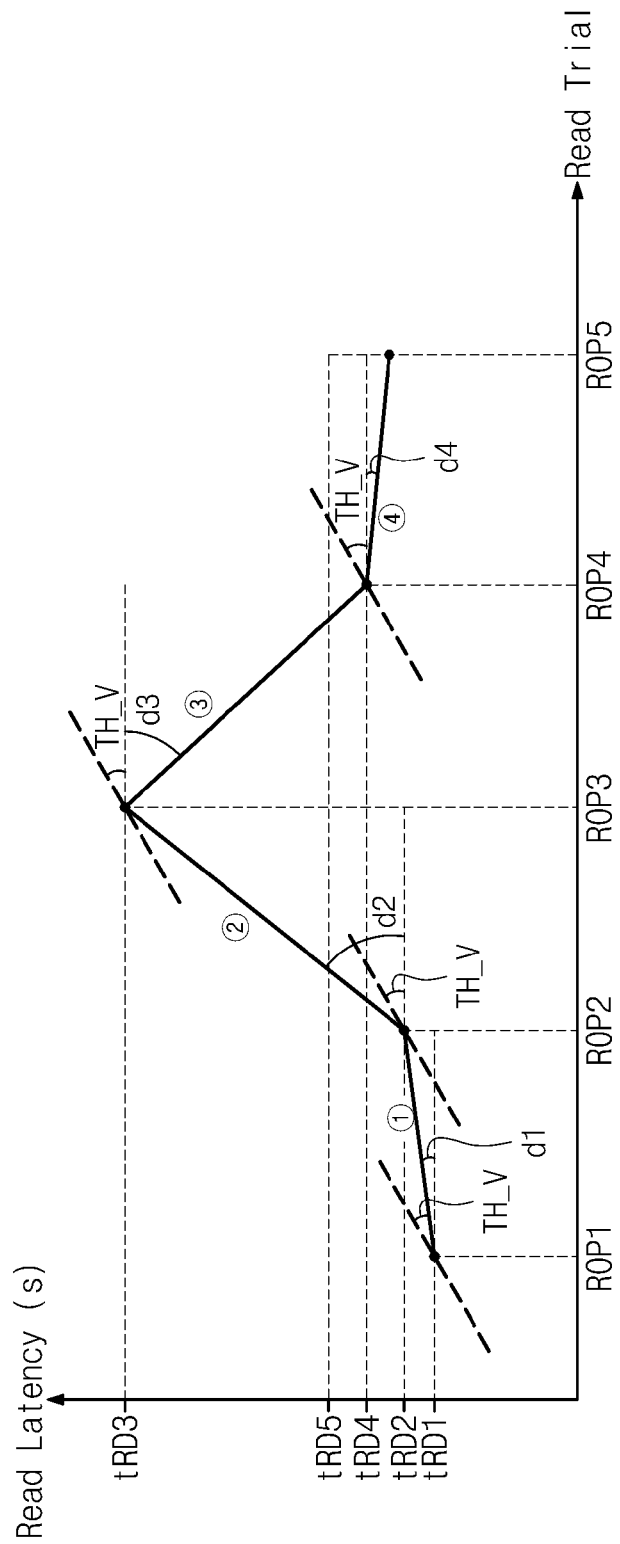
FIG. 6 is a diagram illustrating a process in which a retention manager performs step S140 of FIG. 4 using a read latency table of FIG. 5.

FIG. 6 is a diagram illustrating a process in which a retention manager RM performs step S140 of FIG. 4 using a read latency table RLAT of FIG. 5. It may be assumed that first to fifth read operations ROP1 to ROP5 are performed.

Referring to FIGS. 1 to 6, the abscissa of FIG. 6 denotes first to fifth read operations ROP1 to ROP5 of a read data unit. The ordinate of FIG. 6 denotes first to fifth read latencies tRD1 to tRD5 of the first to fifth read operations about the read data unit.

A graph marked by a solid line of FIG. 6 may include a first line (①) connecting the first latency tRD1 of the first read operation ROP1 and the second latency tRD2 of the second read operation ROP2, a second line (②) connecting the second latency tRD2 of the second read operation ROP2 and the third latency tRD3 of the third read operation ROP3, a third line (③) connecting the third latency tRD3 of the third read operation ROP3 and the fourth latency tRD4 of the fourth read operation ROP4, and a fourth line (④) connecting the fourth latency tRD4 of the fourth read operation ROP4 and the fifth latency tRD5 of the fifth read operation ROP5.

That is, since each of the first to fourth lines may connect read latencies performed with respect to the same read data unit, slopes of the first to fourth lines may mean latency change ratios, respectively.

In FIG. 6, first to fourth latency change ratios d1 to d4 are exemplified. For example, the first latency change ratio may refer to the slope d1 of the first line (①) connecting the first read latency tRD1 and the second read latency tRD2 which are stored in the read latency table RLAT as a result of performing read operations of the read data unit. The second latency change ratio may refer to the slope d2 of the second line (②) connecting the second read latency tRD2 and the third read latency tRD3 which are stored in the read latency table RLAT as a result of performing read operations of the read data unit. The third latency change ratio may refer to the slope d3 of the third line (③) connecting the third read latency tRD3 and the fourth read latency tRD4 which are stored in the read latency table RLAT as a result of performing read operations of the read data unit. The fourth latency change ratio may refer to the slope d4 of the fourth line (④) connecting the fourth read latency tRD4 and the fifth read latency tRD5 which are stored in the read latency table RLAT as a result of performing read operations of the read data unit.

In FIG. 6, a slope of a dotted line may mean a threshold value TH_V. The threshold value TH_V may change according to a kind of a storage device or a driving environment thereof.

Referring to FIGS. 1, 4, and 6, in step S140 of FIG. 4, the retention manager RM of the host device 200 may determine whether each of the first to fourth latency change ratio d1 to d4 exceeds the threshold value TH_V.

In FIG. 6, in the case where a read operation of the read data unit performed on the storage device 300 is the first read operation ROP1, the retention manager RM of the host device 200 may perform step S110 to step S130 and may end the procedure without performing step S140 in which there is determined whether the latency change ratio exceeds the threshold value TH_V.

In the case where the read operation of the read data unit performed on the storage device 300 is the second read operation ROP2, the retention manager RM of the host device 200 may determine that the slope d1 of the first line (①) does not exceed the threshold value TH_V. After step S140, the retention manager RM of the host device 200 may end the procedure.

In the case where the read operation of the read data unit performed on the storage device 300 is the third read operation ROP3, the retention manager RM of the host device 200 may determine that the slope d2 of the second line (②) exceeds the threshold value TH_V. Afterwards, the procedure may proceed to step S150, in which the host device 200 transfers a data retention command CMD_RE to the storage device 300.

In the case where the read operation of the read data unit performed on the storage device 300 is the fourth read operation ROP4, the retention manager RM of the host device 200 may determine that the slope d3 of the third line (③) does not exceed the threshold value TH_V. After step S140, the retention manager RM of the host device 200 may end the procedure.

In an embodiment, the storage device 300 may perform a data retention operation based on the data retention command CMD_RE. For example, the storage device 300 may monitor whether data, for which the retention problem occurs, from among stored data exists. If data for which the retention problem occurs is detected, the storage device 300 may read data from a memory area (e.g., a first memory block BLK1) where the detected data is stored and may write the read data at another memory area (e.g., a second memory block BLK2). The first memory block BLK1 may be erased. For example, the host device 200 may provide the storage device 300 with an address, which is associated with a read operation where the retention problem occurs, together with the data retention command CMD_RE. The storage device 300 may monitor a retention problem based on the address transferred together with the retention command CMD_RE. For example, the storage device 300 may monitor the retention problem of a memory block corresponding to the provided address.

In an embodiment, the storage device 300 may include an algorithm for managing the retention problem internally. In addition, when the host device 200 additionally manages the retention problem, the data integrity of the storage device 300 may be improved.

In the case where the read operation of the read data unit performed on the storage device 300 is the fifth read operation ROP5, the retention manager RM of the host device 200 may determine that the slope d4 of the fourth line (④) does not exceed the threshold value TH_V. After step S140, the retention manager RM of the host device 200 may end the procedure.

According to FIGS. 1 to 6, the memory system 100 according to an embodiment of the disclosure may prevent the retention problem from occurring at the nonvolatile memory device 330 of the storage device 300. Accordingly, it may be possible to provide the memory system 100 with improved reliability even in a high-temperature operating environment or a non-periodic use environment.

Figure 7:
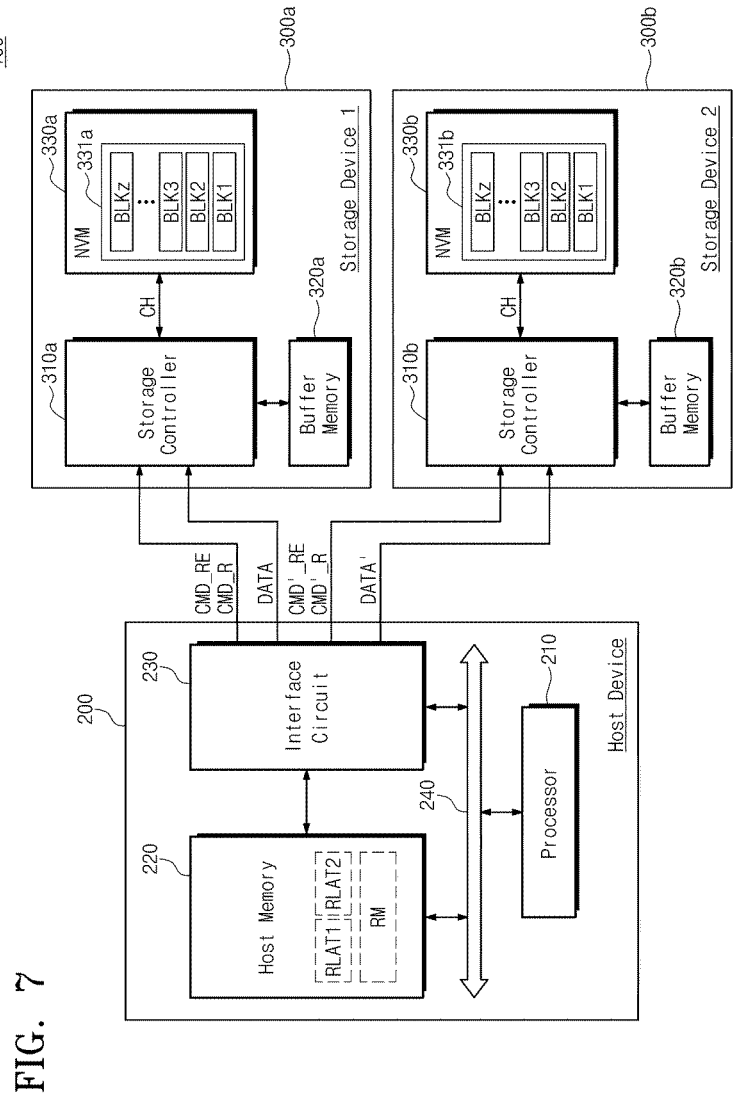
FIG. 7 is a block diagram illustrating a memory system according to an embodiment of the disclosure.

FIG. 7 is a block diagram illustrating a memory system 100 according to another embodiment of the disclosure. Referring to FIG. 7, the memory system 100 according to an embodiment of the disclosure may include the host device 200 and first and second storage devices 300a and 300b.

The host device 200 may provide the first storage device 300a with a first read command CMD_R and a first retention command CMD_RE. The host device 200 may control the first storage device 300 through the first read command CMD_R so as to perform a read operation. The host device 200 may control the storage device 300 through the first retention command CMD_RE so as to perform a data retention operation.

The host device 200 may provide the second storage device 300b with a second read command CMD'_R and a second retention command CMD'_RE. The host device 200 may control the second storage device 300b through the second read command CMD'_R so as to perform a read operation. The host device 200 may control the second storage device 300b through the second retention command CMD'_RE so as to perform a data retention operation.

The retention manager RM of the host device 200 of FIG. 7 may store and manage read latencies for the read commands CMD_R and CMD'_R respectively transferred to the first and second storage devices 300a and 300b in first and second read latency tables RLAT1 and RLAT2. This will be described with reference to accompanying drawings.

In FIG. 7, the first and second storage devices 300a and 300b may be homogeneous. In this case, the read data unit, the read command CMD_R, and the retention command CMD_RE of the first storage device 300a may be the same as the read data unit, the read command CMD'_R, and the retention command CMD'_RE of the second storage device 300b. Furthermore, a first threshold value TH_V1 of the first storage device 300a may be the same as a second threshold value TH_V2 of the second storage device 300b.

In FIG. 7, the first and second storage devices 300a and 300b may be heterogeneous. In this case, the read data unit, the read command CMD_R, and the retention command CMD_RE of the first storage device 300a may be different from the read data unit, the read command CMD'_R, and the retention command CMD'_RE of the second storage device 300b. Furthermore, the first threshold value TH_V1 of the first storage device 300a may be different from the second threshold value TH_V2 of the second storage device 300b.

A detailed description about components, which are the same as those of FIG. 1 or are marked by the same reference numerals, from among components of FIG. 7 will be omitted for convenience.

Figure 8:
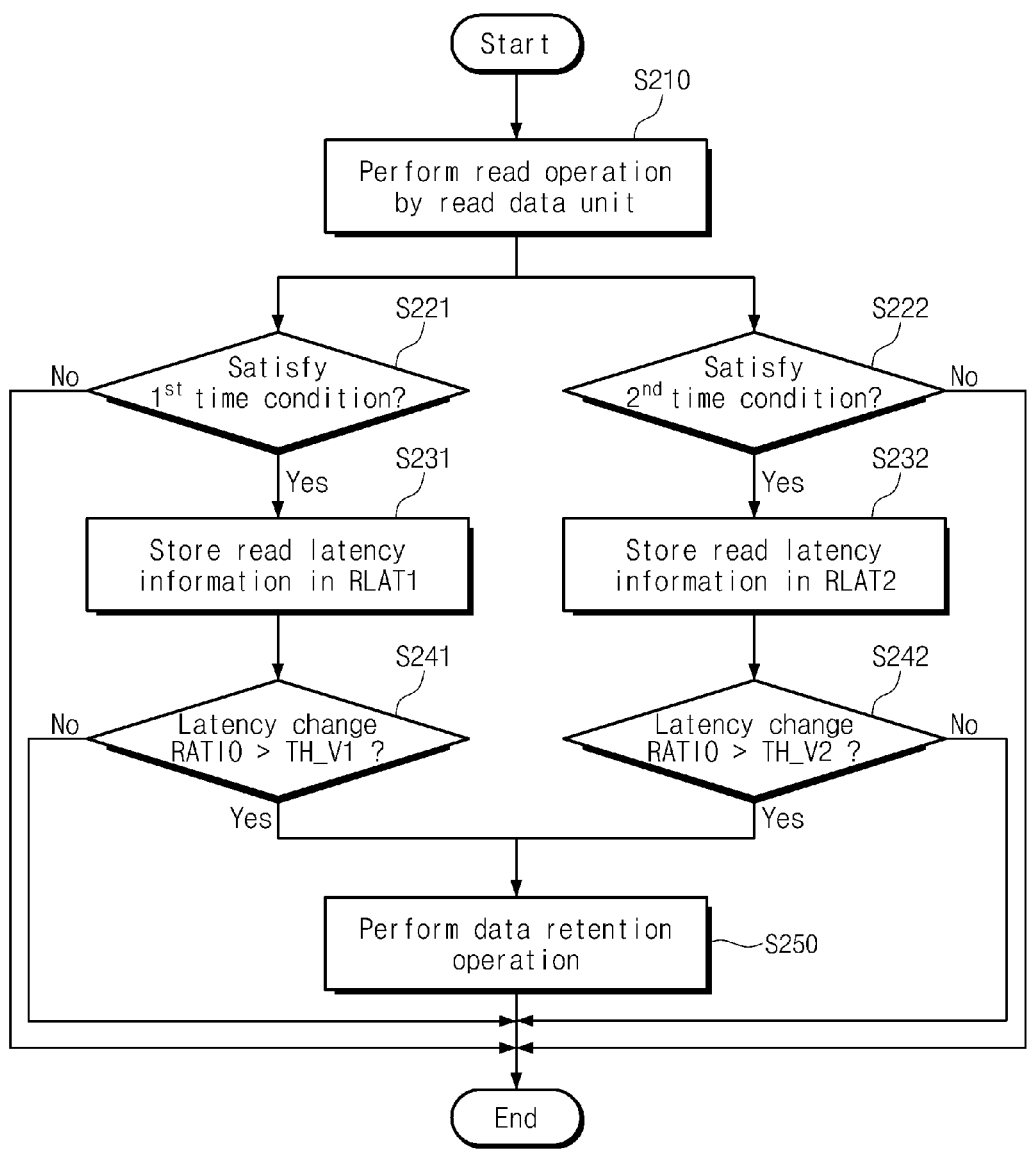
FIG. 8 is a flow chart illustrating an operating method of a memory system according to another embodiment of the disclosure.

FIG. 8 is a flow chart illustrating an operating method of a memory system according to another embodiment of the disclosure.

Referring to FIGS. 7 and 8, it may be assumed that the memory system 100 according to another embodiment of the disclosure includes the host device 100 and the first and second storage devices 300a and 300b. A data retention operating method of the memory system 100 which is executed by a retention manager RM loaded on the host memory 220 of the host device 200 is as follow.

In step S210, the host device 200 may control a plurality of storage devices to perform read operations of read data units. In FIG. 9, the host device 200 may control the first storage device 300a to perform a read operation of a first read data unit independently. Furthermore, the host device 200 may control the second storage device 300b to perform a read operation of a second read data unit independently.

The read data unit may correspond to the size of read data at a host level of the host device 200. For example, in the case where the storage devices 300a and 300b are different in kind from each other, the first read data unit and the second read data unit may be set to be different from each other. In contrast, in the case where the storage devices 300a and 300b are the same as each other in kind, the first read data unit and the second read data unit may be set to be the same as each other.

In step S221, the retention manager RM of the host device 200 may determine whether a read operation of the first read data unit is performed on the first storage device 300a within a specific time. For example, in the case where the current read operation is performed within a specific time from the most-recent previous read operation, the retention manager RM of the host device 200 may end the procedure without storing a read latency of the current read operation.

In step S222, the retention manager RM of the host device 200 may determine whether a read operation of the second read data unit is performed on the second storage device 300b within a specific time. For example, in the case where the current read operation is performed within a specific time from the most-recent previous read operation, the retention manager RM of the host device 200 may end the procedure without storing a read latency of the current read operation.

The amount of data which the host device 200 stores and manages may be reduced according to steps S221 and S222. This may mean that the overhead of the memory system 100 is reduced.

Steps S221 and S222 may be performed by the retention manager RM of the host device 200 simultaneously or sequentially.

In step S231, in the case where the current read operation being performed on the first storage device 300a exceeds a specific time from the most-recent previous read operation, the retention manager RM of the host device 200 may store a read latency of the current read operation for the first read data unit of the first storage device 300a in the first read latency table RLAT1. In particular, a read latency of a read operation may be stored in an electrically erasable and programmable ROM (EEPROM) of the host device 200.

In step S232, in the case where a current read operation being performed on the second storage device 300b exceeds a specific time from the most-recent previous read operation, the retention manager RM of the host device 200 may store a read latency of the current read operation for the second read data unit of the second storage device 300b in the second read latency table RLAT2. In particular, a read latency of a read operation may be stored in an electrically erasable and programmable ROM (EEPROM) of the host device 200.

Steps S231 and S232 may be performed by the retention manager RM of the host device 200 simultaneously or sequentially.

In step S241, the retention manager RM of the host device 200 may determine whether a latency change ratio of the first storage device 300a exceeds the first threshold value TH_V1. For example, the latency change ratio may be a difference between read latencies of the most-recent previous read operation and the current read operation stored in the first read latency table RLAT1. If the latency change ratio is smaller than or equal to the first threshold value TH_V1, the retention manager RM of the host device 200 may end the procedure without performing step S250.

Furthermore, in the case where a read operation by the first read data unit performed on the first storage device 300a is a first read operation, the retention manager RM may end the procedure without determining whether the latency change ratio exceeds the first threshold value TH_V1.

In step S242, the retention manager RM of the host device 200 may determine whether a latency change ratio of the second storage device 300b exceeds the second threshold value TH_V2. For example, the latency change ratio may be a difference between read latencies of the most-recent previous read operation and the current read operation stored in the second read latency table RLAT2. If the latency change ratio is smaller than or equal to the second threshold value TH_V2, the retention manager RM of the host device 200 may end the procedure without performing step S250.

Furthermore, in the case where a read operation by the second read data unit performed on the second storage device 300b is a first read operation, the retention manager RM may end the procedure without determining whether the latency change ratio exceeds the second threshold value TH_V2.

Steps S241 and S242 may be performed by the host device 200 simultaneously or sequentially.

If a latency change ratio of at least one of a plurality of storage devices exceeds a threshold value, the host device 200 may determine the at least one storage device as a storage device having a high probability that a retention problem exists.

In an embodiment, in FIG. 7, if a latency change ratio of at least one of the first and second storage devices 300a and 300b exceeds a threshold value, the retention manager RM of the host device 200 may determine the at least one storage device as a storage device having a high probability that a retention problem exists. Afterwards, the host device 200 may control the at least one storage device, which is determined to have a high probability of a retention problem, so as to perform the data retention operation S250. The data retention operation is described with reference to FIG. 3, and a detailed description thereof is thus omitted.

An embodiment of the disclosure is exemplified as the memory system 100 according to another embodiment of the disclosure includes the first and second storage devices 300a and 300b. However, the scope and spirit of the disclosure may not be limited thereto. For example, the memory system 100 according to another embodiment of the present disclosure may include three or more storage devices.

FIG. 9 is a diagram illustrating read latency tables RLAT1 and RLAT2 for storing and managing read latencies, according to another embodiment of the disclosure.

Referring to FIGS. 7 to 9, the host device 200 may control the first and second storage devices 300a and 300b to perform read operations of the first and second read data units independently.

For example, the retention manager RM of the host device 200 may store read latencies of the first storage devices 300a in the first read latency table RLAT1. The retention manager RM of the host device 200 may store read latencies of the second storage devices 300b in the second read latency table RLAT2.

The retention manager RM of the host device 200 may independently store and manage read latencies stored in the first read latency table RLAT1 and the second read latency table RLAT2.

In an embodiment, the host device 200 may request a monitor read operation from the storage device 300 through the read command CMD_R to monitor whether a retention problem of the storage device 300 occurs, not to obtain data.

A method in which the retention manager RM of the host device 200 independently stores and manages read latencies stored in the first read latency table RLAT1 and the second read latency table RLAT2 is described with reference to FIG. 5, and a description thereof is thus omitted.

The scope and spirit of the disclosure is not limited to the first and second read latency tables RLAT1 and RLAT2 described with reference to FIG. 9 and may be applied to various equivalent embodiments.

Figure 10:
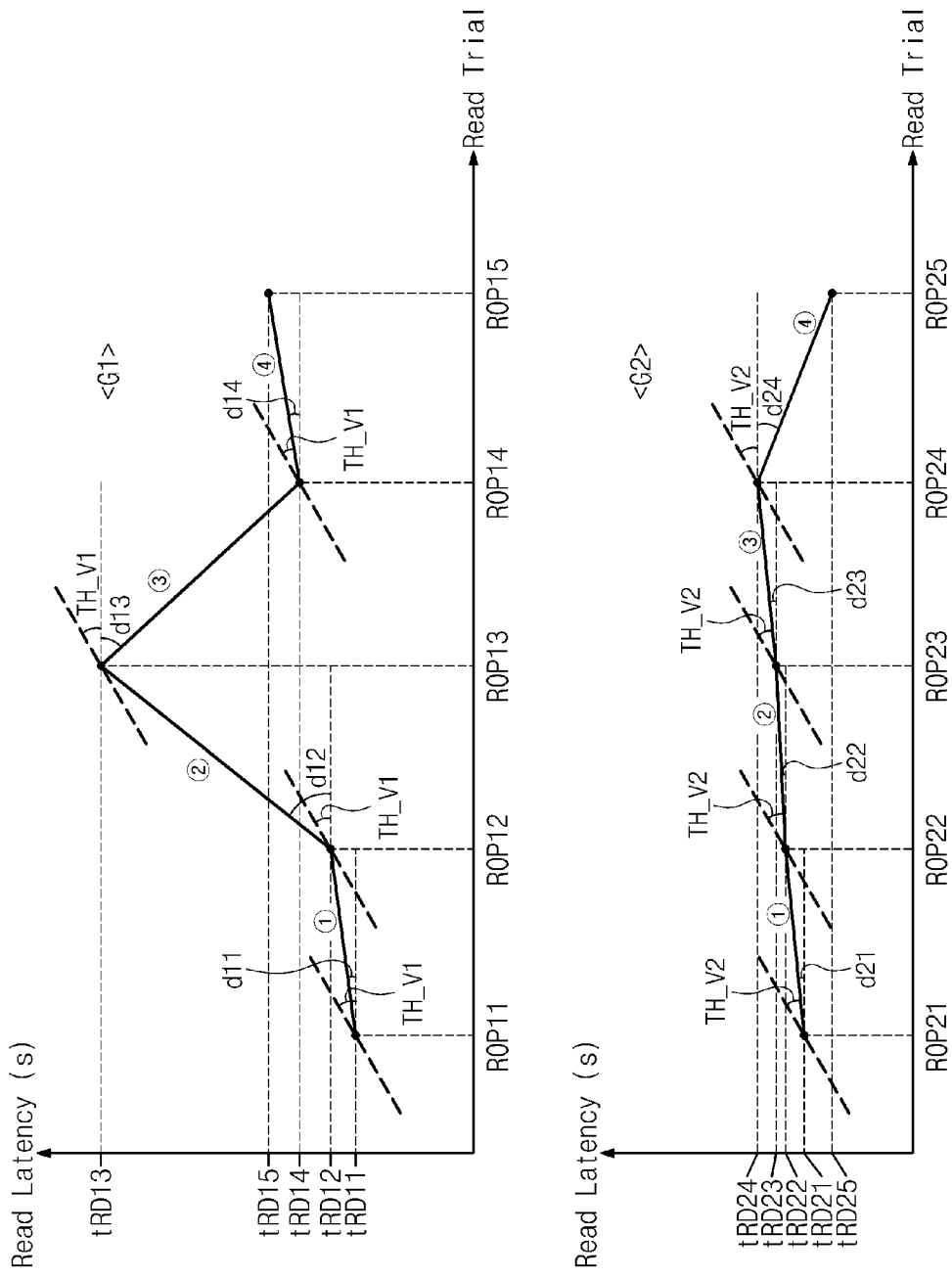
FIG. 10 is a diagram illustrating a process in which a retention manager performs steps S241 and S242 of FIG. 8 using first and second read latency tables of FIG. 9.

FIG. 10 is a diagram illustrating a process in which a retention manager RM performs steps S241 and S242 of FIG. 8 using first and second read latency tables RLAT1 and RLAT2 of FIG. 9.

Referring to FIGS. 7 to 10, in a first graph G1 of FIG. 10, the abscissa denotes first to fifth read operations ROP11 to ROP15 performed at the first storage device 300a. In the first graph G1, the ordinate denotes first to fifth read latencies tRD11 to tRD15 corresponding to the first to fifth read operations ROP11 to ROP15 for the first read data unit of the first storage device 300a.

A graph expressed by a solid line of FIG. 10 may include a first line (①) connecting the first latency tRD11 of the first read operation ROP11 and the second latency tRD12 of the second read operation ROP12, a second line (②) connecting the second latency tRD12 of the second read operation ROP12 and the third latency tRD13 of the third read operation ROP13, a third line (③) connecting the third latency tRD13 of the third read operation ROP13 and the fourth latency tRD14 of the fourth read operation ROP14, and a fourth line (④) connecting the fourth latency tRD14 of the fourth read operation ROP14 and the fifth latency tRD15 of the fifth read operation ROP15.

That is, each of the first to fourth lines (①~④) may connect read latencies performed with respect to the same read data unit, and thus slopes of the first to fourth lines (①~④) may mean latency change ratios, respectively.

In FIG. 10, first to fourth latency change ratios d11 to d14 of the first storage device 300a are exemplified. For example, the first latency change ratio d11 may refer to the slope of the first line (①) connecting the first read latency tRD11 and the second read latency tRD12 which are stored in the first read latency table RLAT1 as a result of performing read operations of the first read data unit. The second latency change ratio d12 may refer to the slope of the second line (②) connecting the second read latency tRD12 and the third read latency tRD13 which are stored in the first read latency table RLAT1 as a result of performing read operations of the first read data unit. The third latency change ratio d13 may refer to the slope of the third line (③) connecting the third read latency tRD13 and the fourth read latency tRD14 which are stored in the first read latency table RLAT1 as a result of performing read operations of the first read data unit. The fourth latency change ratio d14 may refer to the slope of the fourth line (④) connecting the fourth read latency tRD14 and the fifth read latency tRD15 which are stored in the first read latency table RLAT1 as a result of performing read operations of the first read data unit.

In FIG. 10, a slope of a graph expressed by a dotted line may mean a first threshold value TH_V1. The first threshold value TH_V1 may change according to a kind of a storage device or a driving environment thereof.

Referring to FIGS. 1, 7, and 10, in step S241 of FIG. 8, the retention manager RM of the host device 200 may determine whether each of the first to fourth latency change ratios d11 to d14 exceeds the first threshold value TH_V1.

In FIG. 10, in the case where a read operation of the first read data unit performed on the first storage device 300a is a first read operation ROP11, the retention manager RM may end the procedure without determining whether the latency change ratio exceeds the first threshold value TH_V1.

In the case where the read operation of the first read data unit performed on the first storage device 300a is a second read operation ROP12, in step S241, the retention manager RM of the host device 200 may determine that the slope d11 of the first line (①) does not exceed the first threshold value TH_V1. After step S241, the retention manager RM of the host device 200 may end the procedure.

In the case where the read operation of the first read data unit performed on the first storage device 300a is a third read operation ROP13, in step S241, the retention manager RM of the host device 200 may determine that the slope d12 of the second line (②) exceeds the first threshold value TH_V1. Accordingly, in step S250, the host device 200 may transfer a data retention command CMD_RE to the storage device 300. In the case where the read operation of the first read data unit performed on the first storage device 300a is a fourth read operation ROP14, in step S241, the retention manager RM of the host device 200 may determine that the slope d13 of the third line (③) does not exceed the first threshold value TH_V1. After step S241 of FIG. 8, the retention manager RM of the host device 200 may end the procedure.

In the case where the read operation of the first read data unit performed on the first storage device 300a is a fifth read operation ROP15, the retention manager RM of the host device 200 may determine that the slope d14 of the fourth line (④) does not exceed the first threshold value TH_V1. After step S241 of FIG. 8, the retention manager RM of the host device 200 may end the procedure.

Likewise, in a second graph G2 of FIG. 10, the abscissa denotes first to fifth read operations ROP21 to ROP25 performed at the second storage device 300b. In the second graph G2, the ordinate denotes first to fifth read latencies tRD21 to tRD25 corresponding to the second read data unit.

A graph expressed by a solid line of FIG. 10 may include a first line (①) connecting the first latency tRD21 of the first read operation ROP21 and the second latency tRD22 of the second read operation ROP22, a second line (②) connecting the second latency tRD22 of the second read operation ROP22 and the third latency tRD23 of the third read operation ROP23, a third line (③) connecting the third latency tRD23 of the third read operation ROP23 and the fourth latency tRD24 of the fourth read operation ROP24, and a fourth line (④) connecting the fourth latency tRD24 of the fourth read operation ROP24 and the fifth latency tRD25 of the fifth read operation ROP25.

That is, each of the first to fourth lines (①~④) may connect read latencies performed with respect to the same read data unit, and thus slopes of the first to fourth lines (①~④) may mean latency change ratios, respectively.

In FIG. 10, first to fourth latency change ratios d21 to d24 of the second storage device 300b are exemplified. For example, the first latency change ratio d21 may refer to the slope of the first line (①) connecting the first read latency tRD21 and the second read latency tRD22 which are stored in the second read latency table RLAT2 as a result of performing read operations of the second read data unit. The second latency change ratio d22 may refer to the slope of the second line (②) connecting the second read latency tRD22 and the third read latency tRD23 which are stored in the second read latency table RLAT2 as a result of performing read operations of the second read data unit. The third latency change ratio d23 may refer to the slope of the third line (③) connecting the third read latency tRD23 and the fourth read latency tRD24 which are stored in the second read latency table RLAT2 as a result of performing read operations of the second read data unit. The fourth latency change ratio d24 may refer to the slope of the fourth line (④) connecting the fourth read latency tRD24 and the fifth read latency tRD25 which are stored in the second read latency table RLAT2 as a result of performing read operations of the second read data unit.

In FIG. 10, a slope of a graph expressed by a dotted line may mean a second threshold value TH_V2. The second threshold value TH_V2 may change according to a kind of a storage device or a driving environment thereof.

Referring to FIGS. 7 to 10, in step S241 of FIG. 8, the retention manager RM of the host device 200 may determine whether each of the first to fourth latency change ratio d21 to d24 of the second storage device 300b exceeds the second threshold value TH_V2.

In FIG. 10, in the case where a read operation of the second read data unit performed on the second storage device 300b is a first read operation ROP21, the retention manager RM may end the procedure without performing step S242 in which there is determined whether the latency change ratio exceeds the second threshold value TH_V2.

In the case where the read operation of the second read data unit performed on the second storage device 300b is a second read operation ROP22, in step S242, the retention manager RM of the host device 200 may determine that the slope d21 of the first line (①) does not exceed the second threshold value TH_V2. After step S242 of FIG. 8, the retention manager RM of the host device 200 may end the procedure.

In the case where the read operation of the second read data unit performed on the second storage device 300b is a third read operation ROP23, in step S242, the retention manager RM of the host device 200 may determine that the slope d22 of the second line (②) does not exceed the second threshold value TH_V2. After step S242 of FIG. 8, the retention manager RM of the host device 200 may end the procedure.

In the case where the read operation of the second read data unit performed on the second storage device 300b is a fourth read operation ROP24, in step S242, the retention manager RM of the host device 200 may determine that the slope d23 of the third line (③) does not exceed the second threshold value TH_V2. After step S242 of FIG. 8, the retention manager RM of the host device 200 may end the procedure.

In the case where the read operation of the first read data unit performed on the first storage device 300a is a fifth read operation ROP25, the retention manager RM of the host device 200 may determine that the slope d24 of the fourth line (④) does not exceed the first threshold value TH_V2. After step S242 of FIG. 8, the retention manager RM of the host device 200 may end the procedure.

Accordingly, in FIG. 10, if a latency change ratio of the first storage device 300a exceeds the first threshold value TH_V1, the retention manager RM of the host device 200 may determine the first storage device 300a as a storage device having a high probability that a retention problem exists.

Afterwards, the host device 200 may control the first storage device 300a, which is determined as having the high probability that a retention problem exists, so as to perform the data retention operation.

FIG. 11 is a circuit diagram illustrating a memory block BLKa according to an embodiment of the disclosure.

Referring to FIG. 11, a memory block BLKa may include a plurality of cell strings CS11 to CS21 and CS12 to CS22.

The plurality of cell strings CS11 to CS21 and CS12 to CS22 may be arranged along a row direction and a column direction to constitute rows and columns.

For example, the cell strings CS11 and CS12 arranged along the row direction may constitute a first row, and the cell strings CS21 and CS22 arranged along the row direction may constitute a second row. The cell strings CS11 and CS21 arranged along the column direction may constitute a first column, and the cell strings CS12 and CS22 arranged along the column direction may constitute a second column.

Each cell string may contain a plurality of cell transistors. The cell transistors may include ground selection transistors GST, memory cells MC1 to MC6, and string selection transistors SSTa and SSTb. The ground selection transistors GST, memory cells MC1 to MC6, and string selection transistors SSTa and SSTb in each cell string may be stacked in a height direction perpendicular to a plane (e.g., a plane on a substrate of the memory block BLKa) on which the cell strings CS11 to CS21 and CS12 to CS22 are arranged along the rows and the columns.

A plurality of cell transistors may be charge trap type cell transistors of which the threshold voltage changes according to the amount of charges trapped in an insulating layer thereof.

Sources of lowermost ground selection transistors GST may be connected in common to a common source line CSL. Control gates of ground selection transistors GST of the cell strings CS11 to CS21 and CS12 to CS22 may be connected to ground selection lines GSL1 and GSL2, respectively. In an embodiment, ground selection transistors in the same row may be connected to the same ground selection line, and ground selection transistors of different rows may be connected to different ground selection lines. For example, the ground selection transistors GST of the cell strings CS11 and CS12 in the first row may be connected to the first ground selection line GSL1, and the ground selection transistors GST of the cell strings CS21 and CS22 in the second row may be connected to the second ground selection line GSL2.

Connected in common to a word line are control gates of memory cells that are placed at the same height (or order) from the substrate (or the ground selection transistors GST). Connected to different word lines WL1 to WL6 are control gates of memory cells that are placed at different heights (or, orders). For example, memory cells MC1 may be connected in common to a word line WL1. Memory cells MC2 may be connected in common to a word line WL2. Memory cells MC3 may be connected in common to a word line WL3. Memory cells MC4 may be connected in common to a word line WL4. Memory cells MC5 may be connected in common to a word line WL5. Memory cells MC6 may be connected in common to a word line WL6.

In the first string selection transistors SSTa of the cell strings CS11 to CS21 and CS12 to CS22 which have the same height (or order), control gates of the first string selection transistors SSTa in different rows may be connected to different string selection lines SSL1a and SSL2a. For example, the first string selection transistors SSTa of the cell strings CS11 and CS12 may be connected in common to the string selection line SSL1a. The first string selection transistors SSTa of the cell strings CS21 and CS22 may be connected in common to the string selection line SSL2a.

In the second string selection transistors SSTb of the cell strings CS11 to CS21 and CS12 to CS22 which have the same height (or order), control gates of the second string selection transistors SSTb in different rows may be connected to different string selection lines SSL1b and SSL2b.

For example, the second string selection transistors SSTb of the cell strings CS11 and CS12 may be connected in common to the string selection line SSL1b. The second string selection transistors SSTb of the cell strings CS21 and CS22 may be connected in common to the string selection line SSL2b.

That is, cell strings in different rows may be connected to different string selection lines. String selection transistors of cell strings which have the same height (or order) and belong to the same row may be connected to the same string selection line. String selection transistors of cell strings which have different heights (or orders) and belong to the same row may be connected to different string selection lines.

In an embodiment, string selection transistors of cell strings in the same row may be connected in common to a string selection line. For example, the string selection transistors SSTa and SSTb of the cell strings CS11 and CS12 in the first row may be connected in common to a string selection line. The string selection transistors SSTa and SSTb of the cell strings CS21 and CS22 in the second row may be connected in common to a string selection line.

Columns of the cell strings CS11 through CS21 and CS12 through CS22 may be connected to different bit lines BL1 and BL2, respectively. For example, the string selection transistors SSTb of the cell strings CS11 and CS21 may be connected in common to the bit line BL1. The string selection transistors SSTb of the cell strings CS12 and CS22 in the second column may be connected in common to the bit line BL2.

The cell strings CS11 and CS12 may constitute a first plane. The cell strings CS21 and CS22 may constitute a second plane.

In the memory block BLKa, memory cells of each plane placed at the same height may constitute a physical page. The physical page may refer to a unit by which the memory cells MC1 to MC6 are written and read. For example, one plane of the memory block BLKa may be selected by the string selection lines SSL1a, SSL1b, SSL2a, and SSL2b. The cell strings CS11 and CS12 in the first plane may be connected to the bit lines BL1 and BL2 when a turn-on voltage is respectively supplied to the string selection lines SSL1a and SSL1b and a turn-off voltage is respectively supplied to the string selection lines SSL2a and SSL2b. That is, the first plane may be selected. The cell strings CS21 and CS22 in a second plane may be connected to the bit lines BL1 and BL2 when the turn-on voltage is respectively supplied to the string selection lines SSL2a and SSL2b and the turn-off voltage is respectively supplied to the string selection lines SSL1a and SSL1b. That is, the second plane may be selected. In a selected plane, a row of memory cells MC may be selected by the word lines WL1 to WL6. In the selected row, a selection voltage may be applied to the second word line WL2, and a non-selection voltage may be respectively applied to remaining word lines WL1 and WL3 to WL6. That is, a physical page which corresponds to the second word line WL2 of the second plane may be selected by adjusting voltages of the string selection lines SSL1a, SSL1b, SSL2a, and SSL2b and the word lines WL1 to WL6. A write or read operation may be performed with respect to memory cells MC2 in the selected physical page.

In the memory block BLKa, the memory cells MC1 to MC6 may be erased by the memory block or by the sub-block. When erasing is performed by the memory block, all memory cells MC in the memory block BLKa may be simultaneously erased according to an erase request (e.g., an erase request from an external memory controller). When erasing is performed by the sub-block, a portion of memory cells MC1 to MC6 in the memory block BLKa may be simultaneously erased according to an erase request (e.g., an erase request from an external memory controller), and the other thereof may be erase-inhibited. A low voltage (e.g., a ground voltage or a low voltage of which the level is similar to that of the ground voltage) may be supplied to a word line connected to memory cells MC to be erased, and a word line connected to erase-inhibited memory cells MC may be floated.

In an embodiment, the memory block BLKa may include a physical storage space which is distinguished by a block address. Each of the word lines WL1 to WL6 may correspond to a physical storage space which is distinguished by a row address. Each of the bit lines BL1 and BL2 may correspond to a physical storage space which is distinguished by a column address. Each of string selection lines SSL1a and SSL2a or SSL1b and SSL2b in different rows or each of the ground selection lines GSL1 and GSL2 in different rows may correspond to a physical storage space which is identified by a plane address.

The memory block BLKa shown in FIG. 11 is an example. However, the scope and spirit of the disclosure may not be limited thereto. For example, the number of rows of cell strings may increase or decrease. As the number of rows of cell strings is changed, the number of string or ground selection lines and the number of cell strings connected to a bit line may be also changed.

The number of columns of cell strings may increase or decrease. As the number of columns of cell strings is changed, the number of bit lines connected to columns of cell strings and the number of cell strings connected to a string selection line may be also changed.

A height of the cell strings may increase or decrease. For example, the number of ground selection transistors, memory cells, or string selection transistors that are stacked in each cell string may increase or decrease.

In an embodiment, memory cells MC in a physical page may correspond to at least three logical pages. For example, k bits (k being an integer of 2 or more) may be programmed in a memory cell MC. Memory cells MC of a physical page may store k logical pages each of which is composed of n-th bits respectively programmed in memory cells MC.

For example, a physical page may include a physical storage space which is distinguished by a block address, a row address, a column address, and a plane address. One physical page may include two or more logical pages. Each of the logical pages may include a logical storage space which is distinguished by an additional address (or an offset) for identifying logical pages as well as an address of a physical address.

In an embodiment of the disclosure, a three dimensional (3D) memory array is provided. In an embodiment of the disclosure, a three dimensional (3D) memory array is provided. The circuit related to an operation of memory cells may be located in a substrate or on a substrate. The term "monolithic" means that layers of each level of the array are directly deposited on the layers of each underlying level of the 3D memory array.

In an embodiment of the disclosure, the 3D memory array includes vertical NAND strings that are vertically oriented such that at least one memory cell is located over another memory cell. The at least one memory cell may comprise a charge trap layer. Each vertical NAND string may further include at least one selection transistor placed over the memory cells. The at least one selection transistor may have the same structure as the memory cells and may be formed uniformly with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The memory system 100 described with reference to FIGS. 7 to 10 may manage a plurality of storage devices independently at a host level and may prevent a retention problem which can occur at the storage devices. Furthermore, it may be possible to provide the memory system 100 including a plurality of storage devices with improved reliability even in a high-temperature operating environment or a non-periodic use environment.

According to embodiments of the disclosure, a retention problem due to a high-temperature phenomenon or a non-periodic use of a memory device may be prevented by performing a data retention operation at a storage device which is identified when a latency change ratio thereof exceeds a threshold value.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments, it will be apparent to those skilled in the art that various changes and modifications may be made without departing from the spirit and scope of the disclosure. Therefore, it should be understood that the above embodiments are not limiting, but illustrative.

What is claimed is:

1. A method in which a host device controls a storage device, the method comprising:
controlling the storage device to perform a read operation by a read data unit with respect to selected memory areas;
storing a read latency corresponding to the read operation of the storage device in a read latency table of the host device;
determining whether a latency change ratio exceeds a threshold value, based on the read latency stored in the read latency table; and
requesting a data retention operation from the storage device through a retention command when the latency change ratio exceeds the threshold value.

2. The method of claim 1, wherein the read latency is a time when read data by the read data unit is read from the storage device based on a read request of the host device and the read data arrives at the host device.

3. The method of claim 1, wherein the size of the read data unit is adjusted by the host device.

4. The method of claim 1, wherein the latency change ratio is a difference between a read latency of a most-recent previously performed read operation and a read latency of a currently performed read operation.

5. The method of claim 1, wherein during the data retention operation according to the retention command, the storage device stores data stored in the selected memory areas in a buffer memory and writes the data stored in the buffer memory at second memory areas.

6. The method of claim 1, further comprising ignoring a read latency of a currently performed read operation when the currently performed read operation is performed within a specific time after a most-recent previously performed read operation is performed.

7. The method of claim 1, further comprising:
controlling a second storage device to perform a second read operation by a second read data unit with respect to selected second memory areas;
storing a second read latency corresponding to the second read operation of the second storage device in a second read latency table of the host device;
determining whether a second latency change ratio exceeds a second threshold value, based on the second read latency stored in the second read latency table; and
requesting a second data retention operation from the second storage device through a second retention command when the second latency change ratio based on the second read latency table exceeds the second threshold value.

8. The method of claim 7, wherein the first storage device and the second storage device are heterogeneous.

9. The method of claim 8, wherein the threshold value and the second threshold value are adjusted according to a kind of the heterogeneous storage devices.

10. The method of claim 1, wherein the retention command is transferred together with an address of a read operation associated with the read latency exceeding the threshold value.

11. A memory system comprising:
a plurality of storage devices each comprising a plurality of nonvolatile memory devices; and
a host device, wherein the host device:
controls each of the storage devices to perform a read operation by a read data unit with respect to selected memory areas,
stores a read latency corresponding to the read operation performed on each of the storage devices in a read latency table,
determines whether a latency change ratio exceeds a threshold value, based on the read latency table for each storage device, and
requests, through a retention command, a data retention operation from a storage device having a latency change ratio exceeding the threshold value.

12. The method of claim 11, wherein each of the plurality of storage devices further comprises a controller configured to control the plurality of nonvolatile memory devices in response to a control of the host device.

13. The method of claim 11, wherein the read latency table is stored in an internal storage space of the host device.

14. The method of claim 11, wherein each storage device reads data, having a retention problem, from among data stored in a first area of the nonvolatile memory devices in response to the retention command and stores the read data in a second area of the nonvolatile memory devices.

15. The method of claim 11, wherein:
   each of the nonvolatile memory devices comprises cell strings arranged on a substrate,
   each of the cell strings comprises at least one selection transistor and memory cells stacked in a direction perpendicular to the substrate, and
   each of the at least one selection transistor and the memory cells comprises a charge trap layer.

16. A method executed by a host device, the method comprising:
   a) determining a first time difference between the execution of a first read operation of a selected memory cell of a nonvolatile memory and the execution of a previous read operation or program operation of the selected memory cell;
   b) determining a second time difference between the execution of a second read operation, subsequent to the first read operation, of the selected memory cell and the execution of the first read operation;
   c) determining whether the ratio of the second time difference to the first time difference exceeds a first predetermined value; and
   d) communicating, to the nonvolatile memory, a request for the nonvolatile memory to determine the data retention quality of data stored in the memory cell when the ratio exceeds the first predetermined value.

17. The method of claim 16, further comprising omitting the execution of operations (a) through (d) if the first time difference is less than a second predetermined value.

18. The method of claim 16, wherein operations (a) through (d) are executed for each of a plurality of read operations, directed toward the memory cell, communicated by the host to the nonvolatile memory.

19. The method of claim 16, wherein the request comprises a command instructing the nonvolatile memory device to determine the data retention quality of the data stored in the memory cell and the address of the memory cell within the nonvolatile memory device.

20. The method of claims 16, further comprising storing the first time difference within an internal memory of the host.

* * * * *